(12) United States Patent
Zennamo, Jr. et al.

(10) Patent No.: US 6,636,129 B2
(45) Date of Patent: Oct. 21, 2003

(54) TWO-TIERED TUNED FILTER

(75) Inventors: Joseph A. Zennamo, Jr., Skaneateles, NY (US); Joseph N. Maguire, Syracuse, NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

(21) Appl. No.: 10/060,952

(22) Filed: Jan. 30, 2002

(65) Prior Publication Data
US 2002/0101302 A1 Aug. 1, 2002

Related U.S. Application Data
(60) Provisional application No. 60/265,375, filed on Jan. 31, 2001.

(51) Int. Cl.⁷ .................................................. H03H 7/01
(52) U.S. Cl. ....................................... 333/176; 333/485
(58) Field of Search ............................. 333/175, 176, 333/185, 174; 439/620

(56) References Cited

U.S. PATENT DOCUMENTS

| | | | |
|---|---|---|---|
| 4,890,199 A | * 12/1989 | Beutler | 361/818 |
| 4,945,323 A | * 7/1990 | Gerstenberg et al. | 333/185 |
| 5,150,087 A | * 9/1992 | Yoshie et al. | 333/185 |
| 5,278,525 A | 1/1994 | Palinkas | 333/175 |
| 5,770,983 A | 6/1998 | Zennamo, Jr. et al. | 333/175 |
| 6,165,019 A | * 12/2000 | Kha et al. | 439/620 |
| 6,323,743 B1 | 11/2001 | Zelenz et al. | 333/185 |
| 6,380,826 B1 | 4/2002 | Palinkas | 333/175 |

* cited by examiner

Primary Examiner—Seungsook Ham
(74) Attorney, Agent, or Firm—Burr & Brown

(57) ABSTRACT

A reduced length filter including a housing having a female connector end and an opposed male connector end, and a circuit board positioned within the housing. The circuit board has first and second filter sections positioned on upper and lower surfaces thereof, and a ground plane positioned therebetween. The first filter section is in electrical communication with the second filter section. A first isolation shield is provided in electrical communication with the ground plane, and extends from the upper surface of the circuit board in a direction substantially perpendicular thereto and proximate one of first and second ends of the circuit board, and a second isolation shield is provided in electrical communication with the ground plane, and extends from the lower surface of the circuit board in a direction substantially perpendicular thereto and proximate the other one of the first and second ends of the circuit board.

17 Claims, 3 Drawing Sheets

TWO-TIERED TUNED FILTER

CROSS REFERENCE TO RELATED APPLICATION

This application claims the benefit of U.S. Provisional Application No. 60/265,375, filed Jan. 31, 2001, the entirety of which is incorporated herein by reference.

FIELD OF THE INVENTION

The invention generally relates to a tuned CATV filter, and, in particular, to a two-tiered notch filter that has filter sections disposed on opposite sides of an integrated circuit board to allow substantial reduction in the overall length of the filter. The invention also relates to an electronic filter having a filter housing formed from inner and outer housing segments mechanically coupled to one another.

BACKGROUND OF THE INVENTION

It has long been a customary practice for subscription television communication systems, i.e., a system in which the reception of a television program signal (generally recoverable by a group of television receivers) is limited to specifically authorized receivers, to scramble or encode their television transmission signals to prevent unauthorized reception by individuals who have not paid a subscription fee. Conventional hard-wired community antenna systems (CATV), for example, are representative of a typical subscription television communication system, although other systems have been developed that employ radio frequency (RF) transmission to subscribers instead of hardwiring. If the subscription television system provides more than one channel, it is also desirable to provide selected scrambling or securing of individual channels that are used to provide premium services.

One of the methods employed to prevent unauthorized reception is to add a scrambling signal or interfering carrier signal to the television transmission signal between its aural and visual carriers. The scrambling signal is added to the television transmission signal to provide additional information which causes a television receiver to reconstitute the scrambled television transmission signal in an incoherent form. The scrambling signal is removed by passing the scrambled television signal through a tuned notch filter at the site of an authorized television receiver.

Tuned notch filters to be utilized in the video/audio frequency removal or descrambling process must meet several critical requirements. For example, it is critical that the tuned notch filter have a high degree of stability and reliability. It must have high attenuation over the desired frequency band and sharp skirts to minimize unwanted attenuation of adjacent channels. In addition to the electrical requirements, the tuned notch filter must be small, preferably less than 0.825 inch in diameter, to enable the notch filter to be utilized in typical installations where one or more filters are mounted on a directional tap on a strand, in a pedestal, or some other small enclosure. In today's market, more premium services are being offered which necessitates connecting more than one tuned notch filter end to end. It is therefore desirable to minimize the length of the tuned notch filter to allow more notch filters to be connected in the available space of the mounting locations.

The industry has made great strides at reducing the length of tuned filters, such as shown in U.S. Pat. No. 5,770,983, the entirety of which is incorporated herein by reference. The '983 patent discloses a reduced length tuned filter that has transverse oriented coils as shown, for example, in FIG. 3 thereof. This filter represents a significant improvement in reducing the length of a tuned filter. It would be desirable, however, to reduce the length of the filter still further.

In view of the above, it is the object of the invention to provide a tuned filter which is shorter in length, while maintaining the electrical performance and diameter requirements.

SUMMARY OF THE INVENTION

It is an object of the present invention to provide a tuned filter of reduced length when compared to the above-discussed prior art.

A reduced length tuned filter in accordance with one embodiment of the present invention includes a housing having a female connector end and an opposed male connector end, and a circuit board positioned within the housing and having a first end proximate the female connector end and an opposed second end proximate the male connector end. The circuit board has a first filter section positioned on an upper surface thereof, a second filter section positioned on a lower surface thereof, and a ground plane positioned between the upper and lower surfaces. The first filter section is in electrical communication with the second filter section, and each filter section includes at least one tunable coil. An input terminal is connected to the first end of the circuit board and extends within the female connector end of the housing, and an output terminal is connected to the second end of the circuit board and extends within the male connector end of the filter housing. A first isolation shield is provided in electrical communication with the ground plane, and extends from the upper surface of the circuit board in a direction substantially perpendicular thereto and proximate one of the first and second ends of the circuit board, and a second isolation shield is provided in electrical communication with the ground plane, and extends from the lower surface of the circuit board in a direction substantially perpendicular thereto and proximate the other one of the first and second ends of the circuit board.

The overall length of the filter in accordance with the present invention can be reduced substantially by positioning the first and second filter sections on opposite surfaces of the same circuit board. This two-tiered arrangement effectively allows the two filter sections, which are necessary to form a frequency notch, to be positioned within the footprint of a single filter section. Moreover, by positioning a ground plane between the opposed surfaces of the circuit board (e.g., within the center plane of the circuit board), the necessary and critical magnetic shielding between the two filter sections can be achieved to a substantial degree merely by the presence of the ground plane. The first and second isolation shields positioned on opposite surfaces and at opposed ends of the circuit board complete the necessary shielding between the two filter sections.

In accordance with a preferred embodiment of the present invention, the circuit board has opposed longitudinally extending side surfaces, and the ground plane is exposed along those side surfaces. This allows the side surfaces to be attached directly to the inner surface of the filter housing through soldering, for example, to maximize shielding between the two filter sections, especially at the side regions of the circuit board.

In accordance with another embodiment of the present invention, an electronic filter is provided that has a filter housing formed from inner and outer housing segments that are mechanically coupled together through first and second mechanical engagement members formed on the outer surface of the inner housing segment and the inner surface of the outer housing segment, respectively. It is preferred that the first and second mechanical engagement members are complementary in shape, one example being a spline and knurl arrangement.

In accordance with yet another embodiment of the present invention, the electronic filter is provided with inner and outer housing segments, and opposed longitudinal slots are formed in the inner surface of the inner housing segment. Opposite edges of the circuit board are then positioned within the longitudinal slots of the inner housing segment. This facilitates electrical contact between the housing and the circuit board, particularly if the circuit board includes an interior ground plane.

In accordance with another embodiment of the present invention, each of the tunable coils is a radial leaded coil, in that the tuning bore of each coil is positioned substantially parallel to the ground plane of the circuit board. Positioning the coils to extend parallel to the ground plane allows for a substantial reduction in the profile of the filter sections, which in turn allows the filter sections to be positioned on opposite sides of the circuit board and still fit within a filter housing not exceeding 0.825 inches in diameter.

It is also preferred to position the coils on the circuit board so as to extend in a transverse direction substantially perpendicular to the longitudinal axis of the filter housing. This arrangement allows the tuning bores of the coils to be accessed from tuning access holes positioned in the side of the filter housing. Accordingly, the coils can be fine tuned after the filter is substantially assembled, but before the final assembly step of positioning the filter housing within an outer protective metal jacket.

BRIEF DESCRIPTION OF THE DRAWINGS

Further objects, features, and advantages of the invention will become apparent from the following detailed description of preferred embodiments of the invention taken in connection with the accompanying drawings, in which.

DETAILED DESCRIPTION OF THE INVENTION

Figure 1A:
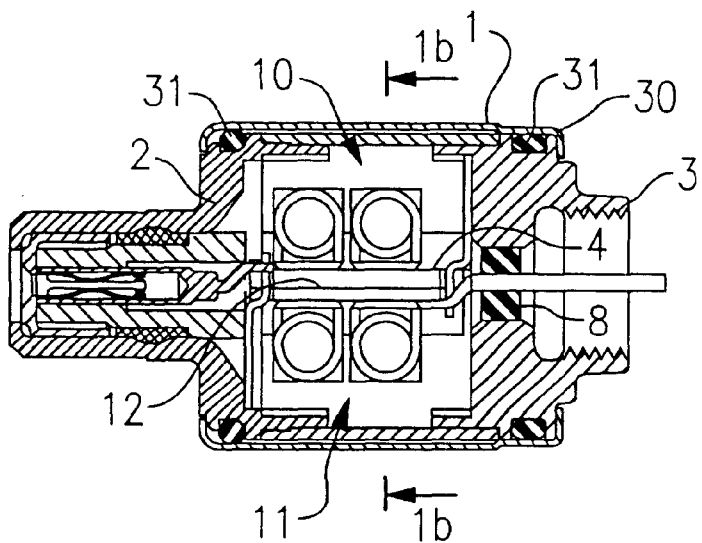
FIGS. 1(a) and 1(b) are cross-sectional views of a filter in accordance with one embodiment of the present invention.
Figure 1B:
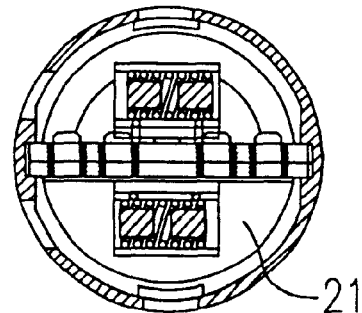

FIGS. 1(a)–(b) are cross-sectional views of a filter in accordance with one embodiment of the present invention. The filter includes a filter housing 1 which is substantially circular in cross-section. A female connector end 2 closes a first end of the filter housing and a male connector end 3 closes an opposed, second end of the filter housing. While these pieces are shown as separate parts, it is possible, of course, to form two or more of the parts integrally with one another (e.g., the filter housing 1 could be formed integrally with female connector end 2). An outer protective sleeve 30 is crimped over the filter housing 1 and connector ends 2 and 3, with sealing o-rings 31 positioned between the outer sleeve and the connector ends.

Figure 2:
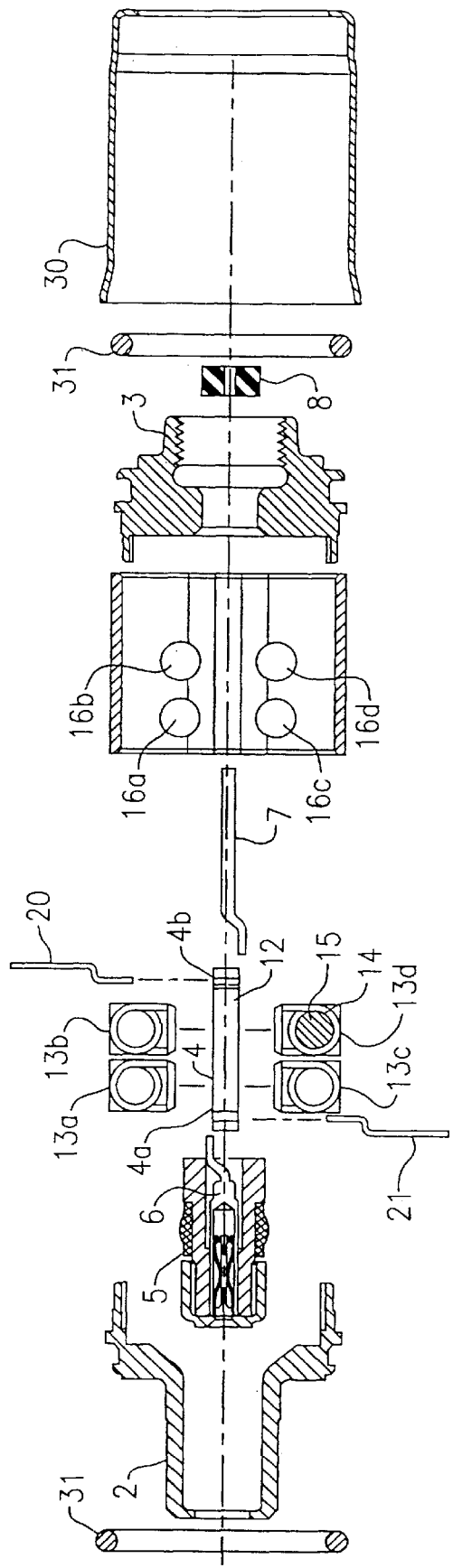
FIG. 2 is an exploded view of the filter of FIGS. 1(a)–(b)

With reference to the exploded view in FIG. 2, a single circuit board 4 is positioned within housing 1 and has a first end 4a proximate female connector end 2 and an opposed second end 4b proximate male connector end 3. A collet contact assembly 5, which functions as an input terminal, is positioned within female connector end 2 and includes a collet contact extension 6 connected to the first end 4a of circuit board 4. The collet assembly 5 can take any form, but it is preferred to use a self-sealing collet assembly such as disclosed in commonly owned U.S. Pat. No. 5,662,494 and U.S. Pat. No. 6,273,766, both of which are incorporated herein by reference. A male "stinger" wire 7 is connected to the second end 4b of circuit board 4, and extends within male connector end 3. An annular seal 8 is positioned between male connector end 3 and wire 7.

It is well known in the art that tuned filters of the type described herein include first and second filter sections that must be magnetically isolated from one another. It is also known that each filter section includes tunable coils, capacitors, and perhaps other electrical components that allow the filter sections, once tuned, to function collectively as a notch filter. In accordance with the present invention, the filter sections are positioned on upper and lower surfaces of circuit board 4. More specifically, as shown in FIG. 1, a first filter section 10 is positioned on an upper surface of circuit board 4, and a second filter section 11 is formed on a lower surface of circuit board 4. A ground plane 12 is positioned between the upper and lower surfaces of circuit board 4, to assist in magnetically isolating the first and second filter sections 10 and 11 from one another.

It is preferred to use radial leaded inductors 13a–13d to reduce the profile of the filter sections. The tuning bore of each radial leaded inductor extends substantially parallel to ground plane 12, which is substantially coplanar with the upper and lower surfaces of circuit board 4. A tuning screw or cylindrical slug 15 is positioned within the tuning bore of each inductor. The tuning screw would be in threaded engagement with the inner surface of the tuning bore, as is common in the art. The cylindrical tuning slug would be frictionally pressed within the tuning bore without any threaded interface therebetween. In the latter case, a simple probe tool could be used to move tuning slug 15 within tuning bore 14 to tune the respective filter section.

It is also preferred that the inductors 13a–13d extend in a direction transverse to the longitudinal axis of the filter housing. This allows the inductors to be tuned after positioned within filter housing 1 through access holes 16a–16d formed through filter housing 1. If tuning slugs are used instead of tuning screws, it is desirable to provide access holes 16a–16d at both sides of filter housing 1, to allow access to the tuning slugs from both sides of the respective tuning bores. This would allow a tuning slug to be accessed from the back in the event it is pushed too far into the tuning bore from the front.

In order to provide sufficient magnetic isolation between first filter section 10 and second filter section 11, it is desirable to position a first isolation shield 20 extending from the upper surface of circuit board 4 in a direction substantially perpendicular thereto, as well as a second isolation shield 21 extending from the lower surface of circuit board 4 in a direction substantially perpendicular thereto. As can be seen in FIG. 1 the first isolation shield is positioned proximate the second end 4b of circuit board 4, while the second isolation shield is positioned proximate the first end 4a of circuit board 4. This arrangement is desirable because the collet contact extension 6 is connected to the upper surface of circuit board 4 at the first end 4a thereof, and the stinger wire 7 is connected to the lower surface of the circuit board 4 at the second end 4b thereof. This arrangement will prevent any incidental contact or shorting between the isolation shields and the collet contact extension 6 and stinger wire 7.

Figure 3:
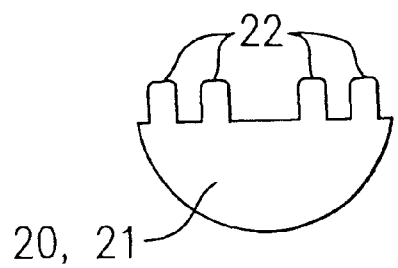
FIG. 3 is a plan view of the isolation shield shown in FIGS. 1(a)–(b) and 2.

FIG. 3 shows that each isolation shield 20, 21 is substantially semi-circular in shape. This shape is dictated by the circular cross-sectional shape of filter housing 1. When installed within filter housing 1, the upper shield 20 fills the upper one-half of filter housing 1 and contacts a portion of male connector end 3, while isolation shield 21 fills the lower one-half of filter housing 1 and contacts a portion of female connector end 2. These isolation shields prevent cross-talk between the filter sections at opposed ends of circuit board 4.

FIG. 3 also shows that each isolation shield includes extension legs 22 that are positioned within circuit board 4 in electrical communication with ground plane 12, preferably through soldering. The central recess between inner extension legs 22 prevents any contact between the isolation shield and collet contact extension 6 and stinger wire 7, respectively.

Although not shown in the drawings, first filter section 10 is connected electrically to second filter section 11 by a staggered conductive throughpath extending through the thickness of circuit board. More specifically, it is preferred that an isolated conductive trace be formed from a portion of ground plane 12 when circuit board 4 is manufactured. A conductive throughhole from the upper surface of circuit board 4 will provide electrical contact between the first filter section 10 and the conductive trace, whereas another conductive throughhole formed through the lower surface of circuit board 4 will provide electrical contact between the second filter section 11 and an opposed end of the conductive trace. The conductive trace would, of course, have to be electrically isolated from ground plane 12, by a suitable isolation space. This staggered conductive path prevents any "line of sight" between the first and second filter sections through circuit board 4.

Figure 4:
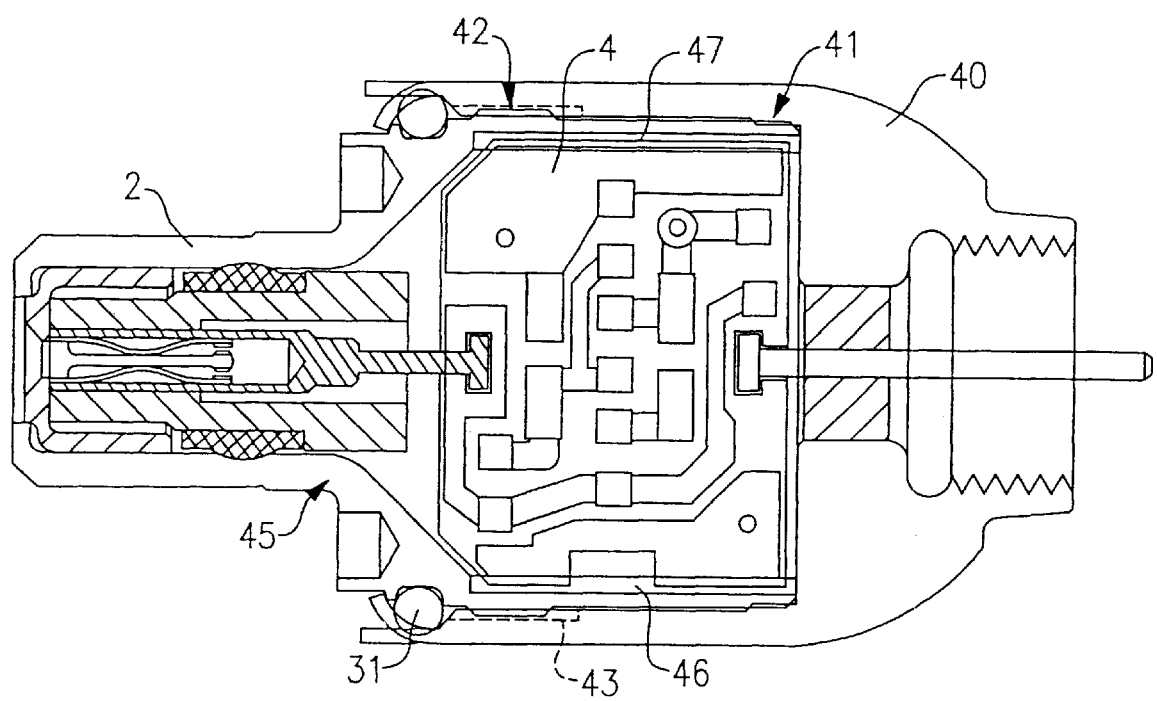
FIG. 4 is a cross-sectional view of a filter in accordance with another embodiment of the present invention.

FIG. 4 shows another embodiment of the present invention, wherein outer protective sleeve 30, filter housing 1 and male connector end 3 have been replaced by a single, unitary outer housing segment 40, and female connector end 2 has been elongated to provide an inner filter housing segment 45. Tuning holes (not shown) are formed through the elongated portion of inner housing segment 45. If the housing was used for a high pass filter, for example, such tuning holes would not be necessary. An end portion 41 of inner filter housing segment 45 preferably is dimensioned to be press-fit within a corresponding section of housing 40.

It is preferred to provide complementary locking members on the inner surface of outer housing segment 40 and the outer surface of inner housing segment 45, to lock the pieces to one another and to prevent rotation of one piece relative to the other. For example, inner filter housing segment 45 includes an external knurl 42 that mates with an inner broached spline 43 formed on outer housing segment 40 to provide mechanical coupling between those two pieces. A suitable adhesive (e.g., Loc-Tite™) can be positioned at this interface, as well, to enhance mechanical coupling and seal the interface between the spline and knurl. Alternatively, the open end of outer housing segment 40 could be rolled over o-ring 31 (as shown in FIG. 4) to provide a weather seal. Another alternative would be to solder the outer housing segment 40 and inner housing segment 45 together.

As also shown in FIG. 4, inner housing segment 45 includes longitudinal slots 46 and 47 formed at opposite portions in the inner surface of inner housing segment 45. The side edges of circuit board 4 are positioned within slots 46 and 47. This facilitates positioning and securing the circuit board within the housing and also facilitates grounding the circuit board to the housing, especially when the circuit board contains an interior ground plane.

Although the invention has been described above with reference to specific preferred embodiments thereof, it will be appreciated that various modifications can be made within the spirit and scope of the appended claims. For example, although the invention has been described with reference to filter sections each having two poles (i.e., two tunable coils), any number of coils could be used in each filter section. In addition, while the circuit board has been described with an integral ground plane within its median plane, it is possible to use two separate circuit boards with a discrete ground shield interposed therebetween. The two separate circuit boards could be touching or spaced from one another. Still further, while the isolation shields have been shown as separate pieces soldered to the circuit in electrical communication with the ground plane, it is possible to form the shields as integral extensions of the discrete ground shield.

What is claimed is:

1. A reduced length tuned filter, comprising:
   a housing having a female connector end and an opposed male connector end;
   a circuit board positioned within said housing and having a first end proximate said female connector end and an opposed second end proximate said male connector end, said circuit board having a first filter section positioned on an upper surface thereof, a second filter section positioned on a lower surface thereof, and a ground plane positioned between said upper and lower surfaces, wherein said first filter section is in electrical communication with said second filter section, and each filter section comprises at least one tunable coil;
   an input terminal connected to said first end of said circuit board and extending within said female connector end of said housing;
   an output terminal connected to said second end of said circuit board and extending within said male connector end of said filter housing;
   a first isolation shield in electrical communication with said ground plane, said first isolation shield extending from said upper surface of said circuit board in a direction substantially perpendicular thereto and proximate one of said first and second ends of said circuit board; and
   a second isolation shield in electrical communication with said ground plane, said second isolation shield extending from said lower surface of said circuit board in a direction substantially perpendicular thereto and proximate the other one of said first and second ends of said circuit board.

2. The filter of claim 1, wherein each of said tunable coils includes a tuning bore passing therethrough, and the tuning bore is positioned substantially parallel to said ground plane and extends in a transverse direction substantially perpendicular to the longitudinal axis of said housing.

3. The filter of claim 2, wherein each of said first and second filter sections includes at least two of said tunable coils positioned in juxtaposition.

4. The filter of claim 2, wherein each of said tunable coils includes a cylindrical tuning slug frictionally positioned within the tuning bore without a threaded interface therebetween, and said tuning slug is movable within said bore to tune the respective filter section.

5. The filter of claim 1, wherein said circuit board has opposed longitudinally extending side surfaces, and said ground plane is exposed along said side surfaces.

6. The filter of claim 5, wherein said filter housing further comprises opposed, longitudinally extending grooves on an inner surface thereof, and at least said side surfaces of said circuit board are received within said slots to provide electrical communication between said filter housing and said ground plane.

7. The filter of claim 1, wherein said filter housing is substantially circular in cross-section and each of said first and second isolation shields is substantially semi-circular in shape.

8. An electronic filter comprising:

an inner housing segment having a first end, an opposed second end, a central portion located between said first end and said second end an outer surface and a first mechanical engagement member extending circumferentially around an annular portion of said outer surface proximate said central portion of said inner housing segment;

an outer housing segment having a first end for receiving at least said second end of said inner housing segment, an opposed second end, an inner surface opposing said outer surface of said inner housing segment, and a second mechanical engagement member extending around an annual portion of said inner surface proximate said first end thereof, wherein said inner and outer housing segments are assembled together to form a filter housing with said first and second mechanical engagement members engaging one another to provide locking engagement between said inner and outer housing segments, a circuit board positioned within said filter housing, wherein said inner and outer housing segments are assembled together to form a filter housing.

9. An electronic filter according to claim 8, wherein said first and second mechanical engagement members are complementary in shape.

10. An electronic filter according to claim 8, wherein said first mechanical engagement member is one of a spline and a knurl, and said second mechanical engagement member is the other one of a spline and a knurl.

11. An electronic filter according to claim 8, farther comprising a bonding agent positioned at least between said first and second mechanical engagement members.

12. An electronic filter according to claim 11, wherein said inner housing segment further comprises an inner surface having slots formed therein for receiving respective edges of said circuit board.

13. An electronic filter according to claim 12, wherein said circuit board includes an interior ground plane that is exposed at said respective edges to provide a ground contact with said filter housing.

14. An electronic filter comprising:

an inner housing segment having a first end, an opposed second end, an outer surface, an inner surface, and opposed longitudinal slots formed in said inner surface;

an outer housing segment having a first end for receiving at least said second end of said inner housing segment, an opposed second end, and an inner surface opposing said outer surface of said inner housing segment; and a circuit board positioned within said filter housing, opposite edges of said circuit board being positioned within said longitudinal slots, respectively.

15. An electronic filter according to claim 8, wherein said first end of said inner housing segment is adapted to receive a collet assembly.

16. An electronic filter according to claim 14, wherein said first end of said inner housing segment is adapted to receive a collet assembly.

17. An electronic signal filter according to claim 8, wherein said first mechanical engagement member extends circumferentially around an annular portion of said outer surface only proximate said central portion of said inner housing segment.

* * * * *

UNITED STATES PATENT AND TRADEMARK OFFICE
CERTIFICATE OF CORRECTION

PATENT NO. : 6,636,129 B2
DATED : October 21, 2003
INVENTOR(S) : Joseph A. Zennamo, Jr. and Joseph N. Maguire It is certified that error appears in the above-identified patent and that said Letters Patent is hereby corrected as shown below:

<u>Column 7,</u>
Line 23, after "housing" add -- ; and wherein said locking engagement is solder-free --.

<u>Column 8,</u>
Line 8, after "segment" add -- , wherein said inner and outer housing segments are assembled together to form a filter housing --.

Signed and Sealed this

Twenty-fifth Day of May, 2004

JON W. DUDAS
*Acting Director of the United States Patent and Trademark Office*